United States Patent
Hazan

(10) Patent No.: US 12,109,704 B2
(45) Date of Patent: Oct. 8, 2024

(54) SIMULATION SIGNATURE KEYS FOR ROBOTIC SIMULATIONS

(71) Applicant: Siemens Industry Software Ltd., Tel Aviv (IL)

(72) Inventor: Moshe Hazan, Elad (IL)

(73) Assignee: Siemens Industry Software Ltd., Tel Aviv (IL)

( * ) Notice: Subject to any disclaimer, the term of this patent is extended or adjusted under 35 U.S.C. 154(b) by 975 days.

(21) Appl. No.: 17/043,056

(22) PCT Filed: Apr. 15, 2018

(86) PCT No.: PCT/IL2018/050422
§ 371 (c)(1),
(2) Date: Sep. 29, 2020

(87) PCT Pub. No.: WO2019/202578
PCT Pub. Date: Oct. 24, 2019

(65) Prior Publication Data
US 2021/0016442 A1 Jan. 21, 2021

(51) Int. Cl.
*B25J 9/16* (2006.01)
*G06F 30/20* (2020.01)

(52) U.S. Cl.
CPC .......... *B25J 9/1664* (2013.01); *B25J 9/1605* (2013.01); *G06F 30/20* (2020.01)

(58) Field of Classification Search
CPC ........ B25J 9/1664; B25J 9/1605; G06F 30/20
See application file for complete search history.

(56) References Cited

U.S. PATENT DOCUMENTS

2009/0089031 A1    4/2009  Sturrock et al.
2011/0153080 A1*   6/2011  Shapiro .................. B25J 9/1666
                                                              700/255
(Continued)

FOREIGN PATENT DOCUMENTS

WO    2013037693 A2    3/2013

OTHER PUBLICATIONS

Anonymous, "What is hashing?—Definition from Whatis.com", Sep. 1, 2005, Retrieved from the Internet: URL: https://searchsqlserver.techtarget.com/definition/hasing [retrieved on Jan. 4, 2019], pp. 1-8.

(Continued)

*Primary Examiner* — Behrang Badii
*Assistant Examiner* — Jay Khandpur

(57) ABSTRACT

Systems and methods may support generation and use of simulation signature keys for robotic simulations. A computer-aided manufacturing (CAM) system may access robotic path data for a robot that includes target locations and corresponding motion parameters for the robot. The CAM system may partition the robotic path data into simulation events according to event partitioning criteria such that each simulation event includes one or multiple target locations and corresponding motion parameters and further generate a respective signature simulation key for each partitioned simulation event. The simulation signature key may provide a lookup key into a motion planning data cache. When an entry exists in the motion planning data cache for a simulation signature key generated for a simulation event, the CAM system may retrieve cached motion planning data for the simulation event. When an entry does not exist, the CAM system may obtain motion planning data through robotic simulation.

16 Claims, 6 Drawing Sheets

(56) References Cited

U.S. PATENT DOCUMENTS

| | | | | |
|---|---|---|---|---|
| 2011/0231016 | A1* | 9/2011 | Goulding | G05D 1/0088 |
| | | | | 901/1 |
| 2017/0136632 | A1* | 5/2017 | Wagner | B25J 9/0093 |
| 2019/0121923 | A1* | 4/2019 | Ringgenberg | G06F 17/40 |
| 2019/0228375 | A1* | 7/2019 | Laury | G05D 1/0088 |

OTHER PUBLICATIONS

PCT International Search Report and Written Opinion of International Searching Authority mailed Jan. 11, 2019 corresponding to PCT International Application No. PCT/IL2018/050422 filed Apr. 15, 2018.

* cited by examiner

SIMULATION SIGNATURE KEYS FOR ROBOTIC SIMULATIONS

BACKGROUND

Computer systems can be used to create, use, and manage data for products and other items. Examples of computer systems include computer-aided manufacturing (CAM) systems, computer-aided engineering (CAE) systems, computer-aided design (CAD) systems, visualization and manufacturing systems, product data management (PDM) systems, product lifecycle management (PLM) systems, and more. These systems may include components that facilitate design and simulated testing of products.

SUMMARY

Disclosed implementations include systems, methods, devices, and logic that may support generation and use of simulation signature keys for robotic simulations.

In one example, a method may be performed, executed, or otherwise carried out by a computer system, such as a CAM system. The method may include accessing robotic path data for a robot, the robotic path data comprising target locations and corresponding motion parameters for the robot, and partitioning the robotic path data into simulation events according to event partitioning criteria such that each simulation event includes one or multiple target locations and corresponding motion parameters. The method may further include, for a given simulation event, generating a simulation signature key for the given simulation event using the one or more target locations and corresponding motion parameters for the given simulation event; obtaining motion planning data for the given simulation event through simulation of the robot according to the given simulation event; and associating the simulation signature key for the given simulation event with the motion planning data obtained for the given simulation event.

In another example, a system may include a motion planning cache and a robotic simulation engine. The robotic simulation engine may be configured to access robotic path data for a robot, the robotic path data comprising target locations and corresponding motion parameters for the robot, and partition the robotic path data into simulation events according to event partitioning criteria such that each simulation event includes one or multiple target locations and corresponding motion parameters. The robotic simulation engine may be further configured to, for each given simulation event of the robotic path data, generate a simulation signature key for the given simulation event using the one or more target locations and corresponding motion parameters for the given simulation event.

Responsive to a determination that the motion planning cache includes an entry for the simulation signature key generated for the given simulation event, the robotic simulation engine may be configured to obtain motion planning data from the motion planning cache for the given simulation event from the entry for the simulation signature key. Responsive to a determination that the motion planning cache does not include an entry for the simulation signature key generated for the given simulation event, the robotic simulation engine may be configured to obtain motion planning data for the given simulation event through simulation of the robot according to the given simulation event; and insert an entry into the motion planning cache pairing the simulation signature key for the given simulation event with the motion planning data obtained for the given simulation event.

In yet another example, a non-transitory machine-readable medium may store processor-executable instructions. When executed, the instructions may cause a system to access robotic path data for a robot, the robotic path data comprising target locations and corresponding motion parameters for the robot; partition the robotic path data into simulation events according to event partitioning criteria such that each simulation event includes a sequence of one or multiple target locations and corresponding motion parameters; and for each given simulation event of the robotic path data, generate a simulation signature key for the given simulation event using the sequence of one or more target locations and corresponding motion parameters for the given simulation event; obtain motion planning data for the given simulation event through simulation of the robot according to the given simulation event; and insert an entry into a motion planning cache pairing the simulation signature key for the given simulation event with the motion planning data obtained for the given simulation event.

Execution of the instructions may further cause the system to access additional robotic path data for the robot; partition the additional robotic path data into additional simulation events according to the event partitioning criteria; and for each additional simulation event of the additional robotic path data, generate a simulation signature key for the additional simulation event; and obtain motion planning data from the motion planning cache for the additional simulation event when with the simulation signature key for the additional simulation event is already stored in the motion planning cache.

BRIEF DESCRIPTION OF THE DRAWINGS

Certain examples are described in the following detailed description and in reference to the drawings.

DETAILED DESCRIPTION

Figure 1:
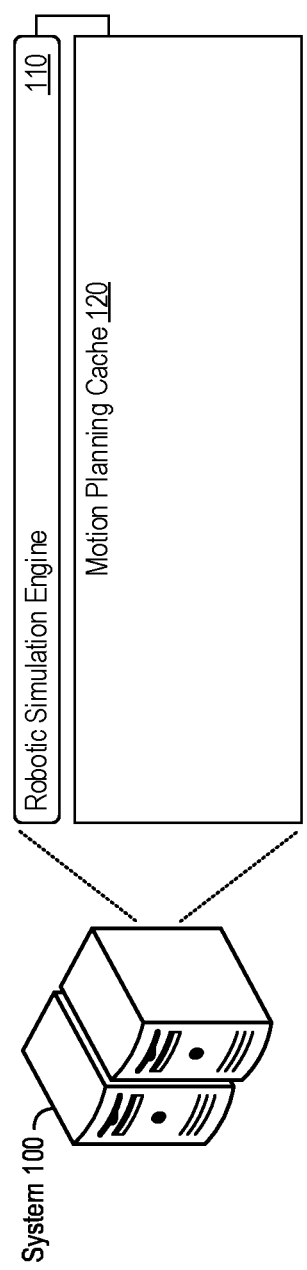
FIG. 1 shows an example of a system that supports generation and use of simulation signature keys for robotic simulations.

The present disclosure relates to robotic simulations. Modern computing systems may use robotic simulations to design and test complex robotic designs and operation prior to physical robotic use. For example, CAM systems may provide mechanisms for machine tool programming, post-processing, and machine simulations to test and program robotic manufacturing tools. Many robotic simulation systems involve iterative (or repetitive) spatial simulations to implement, design, and test robotic functionality in a virtual space prior to actual physical operation.

Robotic simulation processes may involve the generation and use of robotic path data and motion planning data. As used herein (and described in greater detail below), robotic path data may refer to a sequence of target locations (e.g., in a manufacturing environment) and corresponding motion parameters defined for a robot. Various motion parameters are discussed herein, and example motion parameters that may be included within robotic path data include robot configuration data (e.g., pose data), robot location data (e.g., the specific robot part to reach a target location), target zone data, robot speed data, robot motion type data, and more. Robotic path data may be user-generated prior to simulation and specify a general framework of desired robotic movement from which more detailed or complete robot motion data can be generated through simulation. In that regard, robotic path data may include motion data defined for a robot without use of (or prior to) robotic simulation.

Robotic path data may be provided to a simulator for generation of motion planning data. As used herein, motion planning data (sometimes called full motion planning) may refer to output data generated from robot simulation, for example as output by robotic simulations performed in accordance with Realistic Robot Simulation (RRS) frameworks, protocols, or interfaces. Motion planning data may thus include a detailed output of simulated robotic motion, such as robot timing, comprehensive path locations, poses, simulation events, messages, or other control outputs generated via robotic simulations. Generation of motion planning data may be time-consuming, computationally intensive, and costly.

The features described herein may increase the performance efficiency or robotic simulations, and may do so while maintaining the accuracy of emulated robotic movements. As described in greater detail below, CAM systems may generate and use simulation signature keys, which may uniquely identify sequences of target locations specified in robotic path data. Motion planning data obtained for such target location sequences (e.g., obtained through prior simulation) may be cached and reused upon identification of matching simulation signature keys applicable to other sections of the robotic path data or additional robotic path data provided to a CAM system. Doing so may reduce robotic simulation times through lessened use of robotic simulators, which may increase system efficiency, reduce computational times, or reduce cost.

The simulation signature keys may be generated for sequences of (multiple) target locations in robotic path data, and the features described herein may accurately discern between different robotic movement sequences that include the same target location. As such, the simulation signature key features described herein may improve robotic simulation efficiency while maintaining simulation accuracy, allowing for safe reuse of cached motion planning data. These and other robotic simulation features (including simulation signature key features) are described in greater detail below.

FIG. 1 shows an example of a system that supports generation and use of simulation signature keys for robotic simulations. The system 100 may take the form of a computing system, including a single or multiple computing devices such as application servers, compute nodes, desktop or laptop computers, smart phones or other mobile devices, tablet devices, embedded controllers, and more. As described herein, the system 100 may utilize signature simulation keys to manage robotic simulations. For motion planning data previously simulated and associated with a signature simulation key, the system 100 may cache and retrieve such motion planning data upon identification of target location sequences in robotic path data with the same signature simulation key.

As an example implementation, the system 100 shown in FIG. 1 includes a robotic simulation engine 110 that may support robotic simulations in various ways. The system 100 may implement the robotic simulation engine 110 (and components thereof) in various ways, for example as hardware and programming. The programming for the robotic simulation engine 110 may take the form of processor-executable instructions stored on a non-transitory machine-readable storage medium and the hardware for the robotic simulation engine 110 may include a processor to execute those instructions. A processor may take the form of single processor or multi-processor systems, and in some examples, the system 100 implements multiple engine components or system elements using the same computing system features or hardware components (e.g., a common processor and common storage medium).

The example system 100 shown in FIG. 1 also includes a motion planning cache 120. As described in greater detail below, the motion planning cache 120 may store motion planning data obtained from robotic simulations, which the motion planning cache 120 may key according to simulation signature keys associated with the motion planning data. The system 100 may implement the motion planning cache 120 as any suitable data structure, for example as a relational database, lookup table, or other data structure stored on a non-transitory machine-readable medium.

In operation, the robotic simulation engine 110 may access robotic path data for a robot, and the robotic path data may include target locations and corresponding motion parameters for a robot (e.g., as specified through user design). The robotic simulation engine 110 may partition the robotic path data into simulation events according to event partitioning criteria, and may do so such that each simulation event includes one or multiple target locations and corresponding motion parameters. For each given simulation event partitioned from the robotic path data, the robotic simulation engine 110 may generate a simulation signature key for the given simulation event using the one or more target locations and corresponding motion parameters for the given simulation event.

Responsive to a determination that the motion planning cache 120 includes an entry for a simulation signature key generated for the given simulation event, the robotic simulation engine 110 may obtain motion planning data from the motion planning cache 120 for the given simulation event from the entry for the simulation signature key. Responsive to a determination that the motion planning cache 120 does not include an entry for the simulation signature key generated for the given simulation event, the robotic simulation engine 110 may obtain motion planning data for the given simulation event through simulation of the robot according to the given simulation event and insert an entry into the motion planning cache 120 pairing the simulation signature key for the given simulation event with the motion planning data obtained for the given simulation event.

These and other robotic simulation features (including simulation signature key features) are described in greater detail next.

Figure 2:
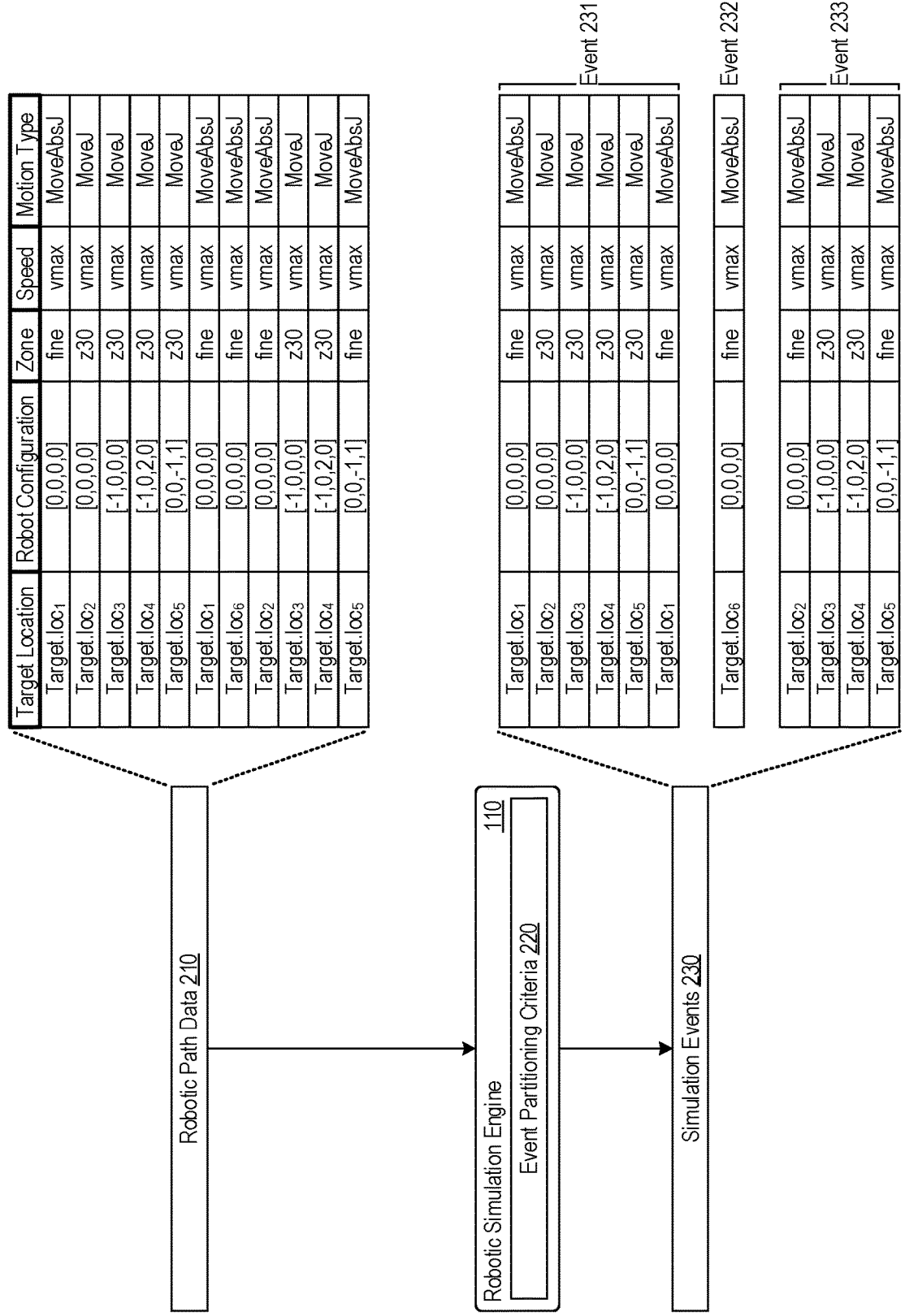
FIG. 2 shows an example partitioning of robotic path data into simulation events by a robotic simulation engine.

FIG. 2 shows an example partitioning of robotic path data into simulation events by the robotic simulation engine 110. By partitioning robotic path data, the robotic simulation engine 110 may divide the robotic path data into specific sequences of target locations. Each of the partitioned sequence of target location(s) and the corresponding motion parameters may be referred to as a simulation event, and the robotic simulation engine 110 may generate a respective simulation signature key for each simulation event partitioned from robotic path data.

To illustrate through the example shown in FIG. 2, the robotic simulation engine 110 accesses the robotic path data 210. As noted above, robotic path data may include user-specified target locations and corresponding motion parameters that provide a general framework of desired robotic movement for a robot or set of robots. The robotic path data 210 shown in FIG. 2 specifies various target locations through a "Target Location" field with values shown in FIG. 2 as "Target.loc$_1$", "Target.loc$_2$", "Target.loc$_3$", etc. Each target location may specify a position (absolute or relative) for the robot to reach, e.g., a specific position in a manufacturing line, a welding position of an object, a contact position with an adjacent robot, or any other desired position in a robotic environment. In other implementations, a target location may be referenced in robotic path data through a targetID field or other Each row in the robotic path data 210 may specify a target location and its corresponding motion parameters. As seen in the robotic path data 210 in FIG. 2, some target locations may occur multiple times in robotic path data.

The robotic path data 210 may specify various motion parameters that correspond to a particular target location. A motion parameter may specify any property for a robot, a target location, robotic movement, or any other attribute associated with the robot or target location. As examples shown in FIG. 2, the robotic path data 210 may specify robot configuration data through the "Robot Configuration" field, robot speed data through the "Speed" field, and robot motion type data through the "Motion Type" field. The robot configuration data may specify any relevant configuration data for the robot, such as a particular robotic pose for the robot upon reaching the target location, e.g., as specified through an array of values for various axes of movement of the robot. In some examples, the robot configuration data defines a requirement, hint, suggestion, or other control parameter specific to the robot reaching a target location. The robot speed data may specify movement speed parameters to reach a target location, whether in absolute terms or relative to a capability of the robot (e.g., maximum or minimum robotic movement speeds). As a robot may be capable of movement along multiple degrees of freedom, the motion type data may specify a particular type of motion for the robot to move to a target location (e.g., direct line motion, circular motion, etc.).

As another example motion parameter shown in FIG. 2, the robotic path data 210 may specify target zone data through a "Zone" field. The target zone data may specify the degree of precision by which the robot can reach a target location, whether precisely at the target location or within an acceptable zone surrounding the target location. Put another way, the target zone data may specify whether the robot is determined to reach a given target location by precisely reaching the given target location or by reaching a zone surrounding the given target location. In FIG. 2 for instance, a "fine" value set for target zone data may specify that a robot is to reach the exact position of the target location whereas a "z30" value set for target zone data may specify that the robot is determined to reach the target location when within 30 millimeters from the target location.

As another example motion parameter, the robotic path data 210 may specify robot location data. Robot location data may specify a particular robotic element, robotic position, or a coordinate of the robot intended to reach the target location. For example, the robot location data may be specify the position data of a robotic welding tip of a robot intended to reach a particular target location. The robot location data may be specified according to a Tool Center Point Frame (TCPF) coordinate or via any other robotic coordinate system.

While some examples of motion parameters are described above and shown in the robotic path data 210 of FIG. 2, the disclosure herein contemplates any number of additional or alternative motion parameters in robotic path data that the robotic simulation engine 110 may recognize and support.

The robotic simulation engine 110 may partition the robotic path data 210 into simulation events according to event partitioning criteria 220, which may be specified based on any number of motion parameters or target locations. To partition the robotic path data 210, the robotic simulation engine 110 may sequentially consider the target locations in the robotic path data 210 and group target locations (and their corresponding motion parameters) into a simulation event when the condition(s) specified by the event partitioning criteria 220 are satisfied.

In some implementations, the event partitioning criteria 220 specifies partitioning each individual target location entry in the robotic path data 210 into a separate simulation event. In other implementations, the event partitioning criteria 220 specifies partitioning the robotic path data 210 into simulation events that include multiple target locations. For instance, the event partitioning criteria 220 may group target locations into simulation events according to a fine-to-fine requirement for target zone data. In such examples, the robotic simulation engine 110 may partition the robotic path data 210 into simulation events such that each of the partitioned simulation events starts and/or ends with a target location that the target zone data specifies the robot is to precisely reach (e.g., a target zone value of "fine").

Additionally or alternatively to target zone data, the event partitioning criteria 220 may be based on any other motion parameters specified in the robotic path data 210. As other examples, the event partitioning criteria 220 may specify partitioning the robotic path data 210 according to robot pose data (e.g., grouping target locations and corresponding motion parameters into a particular simulation event until a particular robot pose or robot pose pattern is reached) or robot speed data (e.g., grouping target locations and corresponding motion parameters into a particular simulation event until a threshold robot speed is reached). As yet another example, the event partitioning criteria 220 may specify grouping the target locations and corresponding motion parameters according to multiple motion parameters, e.g., based a combination of specific threshold values for both robot configuration data and target zone data.

While some specific examples of event partitioning criteria 220 are described herein, the robotic simulation engine 110 may apply any variation of event partitioning criteria 220 as consistently described herein. The event partitioning criteria 220 may be user-configurable, thus based on specific partitioning configurations desired by a system administrator or other user.

In some implementations, specific target locations in the robotic path data 210 may be defined based on preceding target locations. For instance, modal-based robotic path data may have empty fields (or any other predefined substitute value) for some motion parameters, indicating the value of the empty motion parameter is inherited from the prior target location. In these implementations, the robotic simulation engine 110 may identify such motion parameters from previous target locations to evaluate conditions set in the event partitioning criteria 220 and partition simulation events accordingly.

In some implementations, the event partitioning criteria 220 may specify partitioning of the robotic path data 210 such that the order of target locations remains unchanged. In such implementations, the robotic simulation engine 110 may group sequences of consecutive target locations in the robotic path data 210 into a single simulation event, and do so without disrupting or rearranging the order in which the target locations are specified in the robotic path data 210. By ensuring that the sequencing of target locations in the robotic path data 210 remains consistent, the robotic simulation engine 110 may preserve the intended flow or robotic pathing, allowing the robotic simulation engine 110 to recognize identical motion paths and robotic movement flows that may be subsequently present in the robotic path data 210. The robotic simulation engine 110 may thus partition or form a simulation event that includes a sequence of multiple target locations and corresponding motion parameters from the robotic path data 210.

By including multiple target locations (and corresponding motion parameters) into a single simulation event, the robotic simulation engine 110 may account for differences in motion planning data that could occur for a particular target location based on target locations previously reached by a robot or for which the robot is to subsequently reach. Through the event partitioning criteria 220, the robotic simulation engine 110 may ensure simulation events track specific sequences of target locations in the robotic path data 210 to appropriately cache and reuse simulated motion planning data.

To illustrate, the robotic path data 210 may include multiple instances of a particular target location for a robot to reach, and each instance of the particular target location may have identical motion parameters (e.g., multiple instances of "Target.loc$_1$" with identical motion parameters each instance). Simulated motion planning data for each of these multiple instances may differ due to the differing sequences of prior or subsequent target locations reached by the robot. That is, simulation of a first instance of "Target.loc$_1$" in the robotic path data may yield different motion planning data from a second instance of "Target.loc$_1$", even when the motion planning parameters for each instance are identical. By partitioning simulation events to include sequences of multiple target locations, the event partitioning criteria 220 may identify, correlate, or track pathing patterns by a robot to ensure safe reuse of cached motion planning data. That is, cached motion planning data for a simulation event may account for sequences of target locations in robotic path data, not just individual target locations. Thus, the robotic simulation engine 110 may partition various instances of "Target.loc$_1$" to different, non-identical simulation events based on the sequence of target locations that precede or follow each instance of "Target.loc$_1$".

In FIG. 2, the robotic simulation engine 110 partitions the robotic path data 210 into simulation events according to event partitioning criteria 220 specifying a "fine-to-fine" requirement for target zone data. In doing so, the robotic simulation engine 110 groups target locations into the simulation events 230, which include the simulation events 231-233 shown in FIG. 2. In this example, the robotic simulation engine 110 groups target locations and corresponding motion parameters in the robotic path data 210 such that each partitioned simulation event starts and/or ends with a target location with a corresponding target zone data value of "fine".

To further illustrate the example "fine-to-fine" requirement partitioning shown in FIG. 2, the robotic simulation engine 110 may start with a first target location and continue to group successive target locations of the robotic path data 210 into a simulation event based on whether the target zone data of the first target location specifies precisely reaching the target location (target zone data has a "fine" value) or reaching a zone surrounding the target location (target zone data has a non-"fine" value).

When the first target location considered for a simulation event has a non-"fine" value for its target zone data (e.g., when the sole condition of the fine-to-fine requirement is to end a target zone data with a "fine" value), the robotic simulation engine 110 may group each successive target location in the robotic path data 210 together into a simulation event until a target location with a "fine" value for its target zone data is reached. The robotic simulation engine 110 may group this ending target location with a "fine" value for its target zone data into the simulation event as well.

When the first target location considered for a simulation event has a "fine" value for its target zone data, the robotic simulation engine 110 may consider the next target location in the robotic path data 210. If the next target location has a non-"fine" value for its target zone data, the robotic simulation engine 110 may group this next target location and each successive target location in the robotic path data 210 together into a simulation event until a target location with a "fine" value for its target zone data is reached. As similarly noted above, the robotic simulation engine 110 may group this ending target location with a "fine" value for its target zone data into the simulation event as well. Examples of simulation events partitioned in such a way are shown via the simulation event 231 and the simulation event 233 in FIG. 2. If instead the next target location considered for a simulation event has a "fine" value for its target zone data, the robotic simulation engine 110 may partition this first target location as its own simulation event without other target locations and consider the next target location as part of another simulation. Such an example is seen through the simulation event 232 in FIG. 2, in which the robotic simulation engine 110 partitions a single target location into its own simulation event.

In some implementations, partitioning simulation events by the robotic simulation engine 110 may include supplementing a given simulation event with additional data related to the given simulation event. The nature and details of data supplementation may be specified by the event partitioning criteria 220. By doing so, the robotic simulation engine 110 may ensure generation of unique simulation signature keys that may account for inherited motion parameters from target locations that precede or follow the target location(s) partitioned into a given simulation event. For instance, the robotic simulation engine 110 may supplement a given simulation event to inherit selected motion parameters extracted from target location(s) preceding or subsequent to a given simulation event, e.g., to account for target location sequencing by supplementing a given simulation event with additional data specifying the target location (or sequence of target locations) that directly precede or follow a given simulation event.

To provide a specific illustration, the robotic simulation engine 110 may supplement a simulation event partitioned as a single target location (e.g., simulation event 232 from FIG. 2), and so by adding previous target location data or subsequent location data to the simulation event 232 itself. The previous target location data may indicate the prior target location from which the robot is moving from (or begins movement from) with respect to the robot movement defined for the given simulation event. The subsequent target location data may specify the next target location following the given simulation event. Using the simulation event 232 as a given example, the robotic simulation engine 110 may, as part of the partitioning process, supplement the simulation event 232 with previous target location data specifying "Target.loc$_1$" (in this case, the ending target location of preceding simulation event 231). As another example, the robotic simulation engine 110 may supplement the simulation event 232 with subsequent target location data specifying "Target.loc$_2$" (in this case, the initial target location of subsequent simulation event 233).

By adding previous target location data to a given simulation event, the robotic simulation engine 110 may ensure that the partitioned simulation event 232 (as supplemented) is differentiated from another simulation event with the same target location and motion parameters as the simulation event 232, but with differing previous or subsequent target location data. As the differing previous location data for these simulation events may yield different motion planning data, the robotic simulation engine 110 may ensure generation of different simulation signature keys for these simulation events through the addition of the previous target location data. In a similar manner, the robotic simulation engine 110 may supplement a given simulation event with any number of additional or alternative motion parameters from preceding or subsequent simulation events or target locations relative to the given simulation event (e.g., previous robot configuration data, subsequent robot speed data, etc.).

The robotic simulation engine 110 may selectively supplement simulation events with additional data according to the event partitioning criteria 220. For example, the event partitioning criteria 220 may specify that the robotic simulation engine 110 supplement each simulation event that is partitioned as a single target location with additional data, but not supplement simulation events partitioned with multiple target locations. In other examples, the event partitioning criteria 220 may specify that the robotic simulation engine 110 supplement simulation events with more than a threshold number of target locations, and not supplement otherwise. Other supplement conditions may be user-specified or configured according to the event partitioning criteria 220.

In any of the ways described herein, the robotic simulation engine 110 may partition robotic path data into simulation events, from which (and for which) the robotic simulation engine 110 may generate simulation signature keys.

Figure 3:
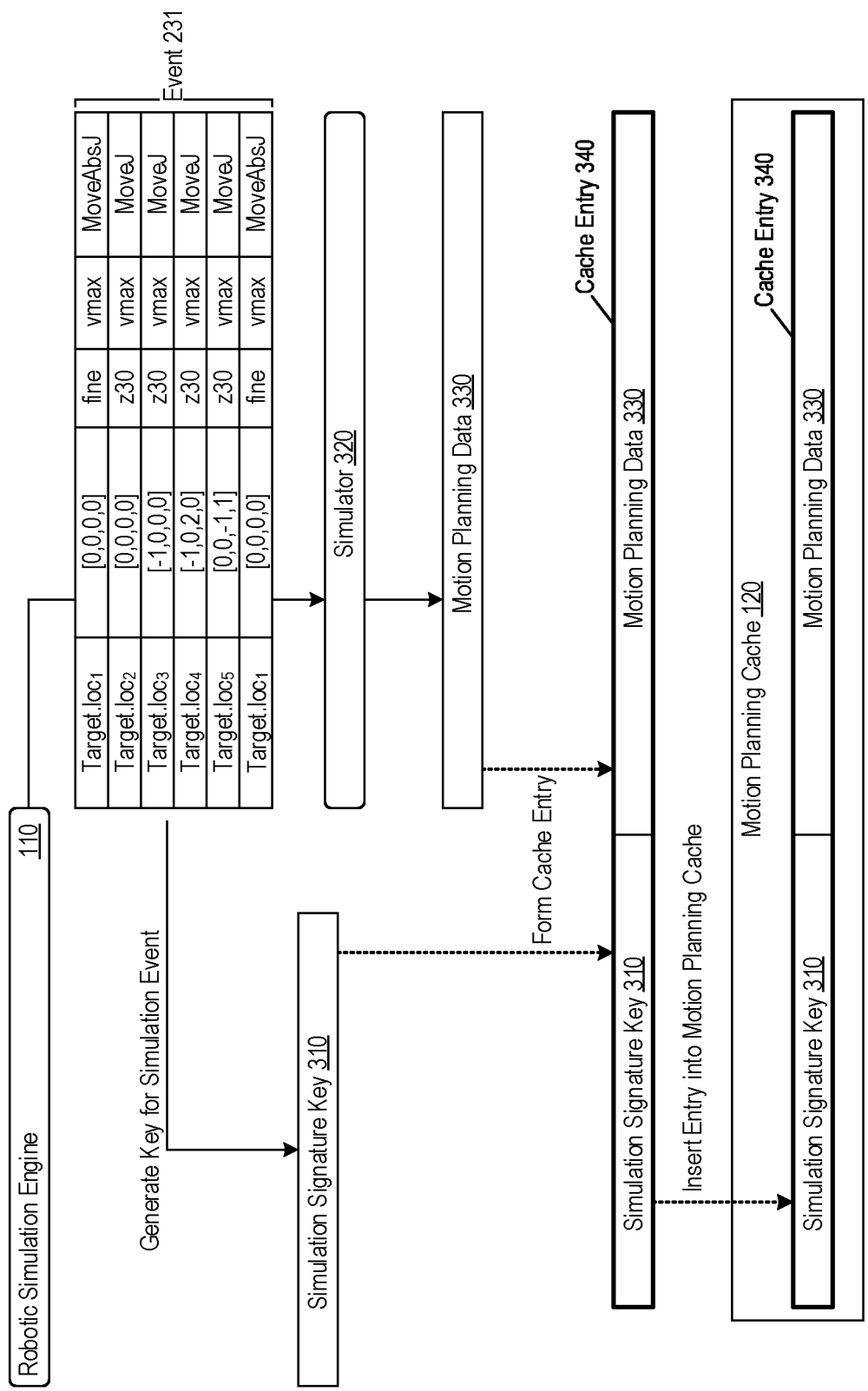
FIG. 3 shows an example of simulation signature key generation and entry insertion into a motion planning cache by the robotic simulation engine.

FIG. 3 shows an example of simulation signature key generation and entry insertion into the motion planning cache 120 by the robotic simulation engine 110. The robotic simulation engine 110 may generate a simulation signature key for some or all of the simulation events partitioned from robotic path data. The example shown in FIG. 3 is presented specifically with respect to an example simulation event 231, for which the robotic simulation engine 110 generates the simulation signature key 310.

The robotic simulation engine 110 may generate the simulation signature key 310 in any way that uniquely represents the sequence of target locations and the particular motion parameters of the simulation event 231. That is, the simulation signature key 310 may be generated such that it differs from any simulation signature keys generated for other simulation events with any differing (additional or alternative) target location, differing corresponding motion parameter, or both. In some implementations, the robot simulation engine 110 generates the simulation signature key 310 as a string or concatenation of the values of the simulation event 231 itself (or a selected subset thereof). In other implementations, the robotic simulation engine 110 applies a key generation function (e.g., a hash value function or other suitable keying function) using the simulation event 231 as an input, e.g., as a string or concatenation of the values of the simulation event 231 or a selected subset thereof.

In a consistent manner, the robotic simulation engine 110 may generate simulation signature keys for partitioned simulation events. A simulation signature key may provide a control mechanism by which the robotic simulation engine 110 obtains motion planning data, whether through simulation or cache lookups. Accordingly, the robotic simulation engine 110 may obtain motion planning data for the simulation event 231 from different sources using the simulation signature key 310 generated for the simulation event 231.

For instance, the robotic simulation engine 110 may query a motion planning cache 120 using the simulation signature key 310 as a lookup value. When the motion planning cache 120 includes an entry for the simulation signature key 310, the robotic simulation engine 110 may retrieve and use cached motion planning data for the simulation event 231 from the motion planning cache 120. When the motion planning cache 120 does not include an entry for the simulation signature key 310 (which is the case for the example shown in FIG. 3), the robotic simulation engine 110 may obtain motion planning data for the simulation event 231 through robotic simulation.

As shown in FIG. 3, the robotic simulation engine 110 may provide the simulation event 231 (or portions thereof) as an input to a simulator 320, which may be any robotic simulator that simulates or generates robot motion from robotic path data inputs. The simulator 320 may take the form of a RRS simulator, and thus generate motion planning data via any number of robotic simulation techniques or motion planning algorithms. As an output, the simulator 320 may produce the motion planning data 330 for the simulation event 231.

Upon obtaining the motion planning data 330 simulated by the simulator 320 for the simulation event 231, the robotic simulation engine 110 may associate the obtained motion planning data 330 with the simulation signature key 310 to support subsequent reuse. For instance, the robotic simulation engine 110 may form a cache entry 340 for the motion planning cache that pairs the simulation signature key 310 generated for the simulation event 231 with the motion planning data 330 obtained for the simulation event 231. Then, the robotic simulation engine 110 may insert the cache entry 340 into the motion planning cache 120 for subsequent access and reuse. One such example of subsequent access and reuse is shown next in FIG. 4.

Figure 4:
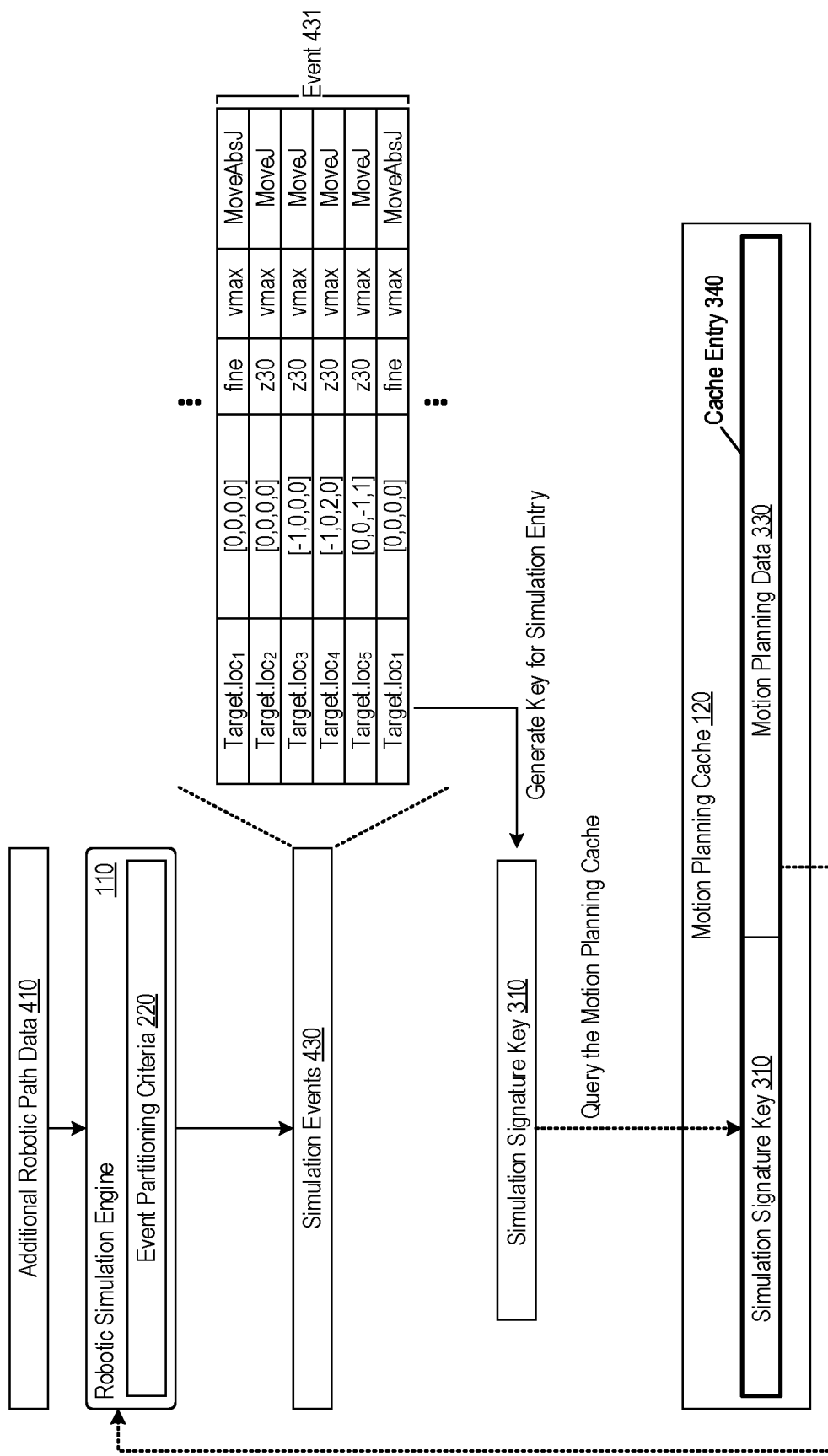
FIG. 4 shows an example lookup into the motion planning cache by the robotic simulation engine.

FIG. 4 shows an example lookup into the motion planning cache 120 by the robotic simulation engine 110. The example lookup depicted in FIG. 4 may occur after the insertion of the cache entry 340 for the simulation signature key 310 described in FIG. 3.

In FIG. 4, the robotic simulation engine 110 accesses additional robotic path data 410, which may be a subsequent portion of the robotic path data 210 discussed in FIG. 2 or a different set of robotic path data produced for robotic simulation. The robotic simulation engine 110 may partition the additional robotic path data 410 according to the event partitioning criteria 220 into the simulation events 430. The simulation events 430 may include the additional simulation event 431 shown in FIG. 4, which (in this example) is identical to the simulation event 231 shown in FIG. 2. As such key generation for the additional simulation event 431 by the robotic simulation engine 110 may result in a simulation signature key 310 that matches (e.g., is identical to) the simulation signature key 310 generated for the simulation event 231. This makes sense as the simulation event 231 is identical to the additional simulation event 431, thus resulting in generation of identical simulation signature keys.

The robotic simulation engine 110 may obtain motion planning data for the additional simulation event 431 through use of the simulation signature key 310. To do so, the robotic simulation engine 110 may perform a query into the motion planning cache 120 using the simulation signature key 310 as a lookup value. In this case, the lookup may result in a hit as the cache entry 340 was previously inserted into the motion planning cache 120 by the robotic simulation engine 110. Thus, the robotic simulation engine 110 may access the motion planning data 330 for the additional simulation event 431 from the motion planning cache 120, doing so instead of simulating a robot according to the additional simulation event 431 from the additional robotic path data 410.

In some implementations, the robotic simulation engine 110 may modify selected portions of the motion planning data 330 retrieved from the motion planning cache 120. The robotic simulation engine 110 may do so to account for any data or elements of the motion planning data 330 that differ between different simulation iterations. For instance, the robotic simulation engine 110 may increment counter data or other tracking parameters indicative of how many times a particular target location is reached during simulation, as cached motion planning data 330 may specify counter data or other tracking parameters from a previous simulation iteration. To perform such modifications, the robotic simulation engine 110 may separately maintain or track counts or other event-type information during simulation, and modify or insert any such values applicable to a particular simulation iteration for the motion planning data 330.

To provide an illustrative example, some robotic simulations track or generate messaging upon reaching a target location during simulation, such as an eventID that changes (e.g., increments) each time a particular target location is reached during simulation. In some implementations, the eventID may also be tied to a currentTargetID indicative of a current target location reached during simulation. In such cases, the motion planning data 330 stored in the motion planning cache 120 may register or include eventIDs tied to an initial simulation iteration during which the motion planning data 330 was generated (e.g., as obtained from through robotic simulation of the simulation event 231 through the simulator 320).

To modify this motion planning data 330 for a subsequent simulation iteration in which the robotic simulation engine 110 uses the cached motion planning data 330 instead of robotic simulation, the robotic simulation engine 110 may increment, adjust, modify, or insert any affected eventID or currentTargetID values to appropriately reflect the current simulation iteration. The robotic simulation engine 110 may offset an eventID by a number of simulation iterations previously performed or by a number of times a particular target location was previously reached. Also, the robotic simulation engine 110 may increment the offset eventID upon reaching each target location during simulation.

To support such modifications, the robotic simulation engine 110 may track the number of simulation iterations performed for a particular simulation signature key, whether through use of a simulator or retrieval of motion planning data from the motion planning cache 120. In some examples, the robotic simulation engine 110 may maintain separate mappings, counters, or other data structures to appropriately track such motion planning data or other simulation data affected by or differing between successive simulation iterations of the matching simulation events. Additionally or alternatively, the robotic simulation engine 110 may track global counters, variables, or data that increment or change during simulation, whether for matching or differing simulation events. As such, the robotic simulation engine 110 may modify selected portions of obtained motion planning data.

In some instances, the robotic simulation engine 110 may determine that the motion planning cache 120 does not include an entry for a simulation signature key generated for the additional simulation event, for example responsive to a lookup miss in the motion planning cache 120. In such instances, the robotic simulation engine 110 may simulate the robot according to the additional simulation event to obtain motion planning data for the additional simulation event and insert an entry into the motion planning cache 120 that pairs the simulation signature key for the additional simulation event with the motion planning data obtained for the additional simulation event through simulation.

The robotic simulation engine 110 may thus generate and use simulation signature keys to efficiently and safely use cached motion planning data.

Different operation modes may support various lookup and simulation sequences by the robotic simulation engine 110. In some examples, the robotic simulation engine 110 operates in a "dynamic lookup" mode in which the robotic simulation engine 110 performs lookups into the motion planning cache 120 and following cache entry retrievals or robotic simulations based on lookup results.

In other examples, the robotic simulation engine 110 may support "active simulation" and "inactive simulation" modes. In an "active simulation" mode (also referred to as a "recording mode"), the robotic simulation engine 110 may partition robotic path data into simulation events and provide each partitioned simulation event to a simulator 320 for robotic simulation. Generated simulation signature keys and obtained motion planning data from the robotic simulations are stored in the motion planning cache 120. In this "active simulation" mode, the simulator 320 may be consistently used to generate motion planning data and populate a motion planning cache 120.

In an inactive simulation mode, the robotic simulation engine 110 may obtain motion planning data with use of the simulator 320, e.g., through generation of simulation signature keys and use of the motion planning cache 120 to retrieve motion planning data. When a lookup miss in the motion planning cache 120 occurs during the "inactive simulation mode", the robotic simulation engine 110 may return an error message to a user or, in some implementations, activate or access the simulator 320 for simulation.

Such "active simulation" and "inactive simulation" modes may be supported to control use of the simulator 320. As robotic simulations may be costly and computationally expensive, setting different operation modes may allow the robotic simulation engine 110 to specifically control active use (or disable use) of simulators, even supporting robotic movement planning and simulations without simulator use in the "inactive simulation" mode. Different workstations or clients in a CAM environment may share use of robotic simulators, and such operation modes may promote effective distribution of simulation resources. For instance, a CAM system or the robotic simulation engine 110 may support export or import of the motion planning cache 120 to support "offline" robotic simulations using previously obtained motion planning data. Such robotic simulations may thus be possible even when a simulator 320 is unavailable, inactive, disconnected, or otherwise inaccessible (e.g., no site licenses available for present use).

Figure 5:
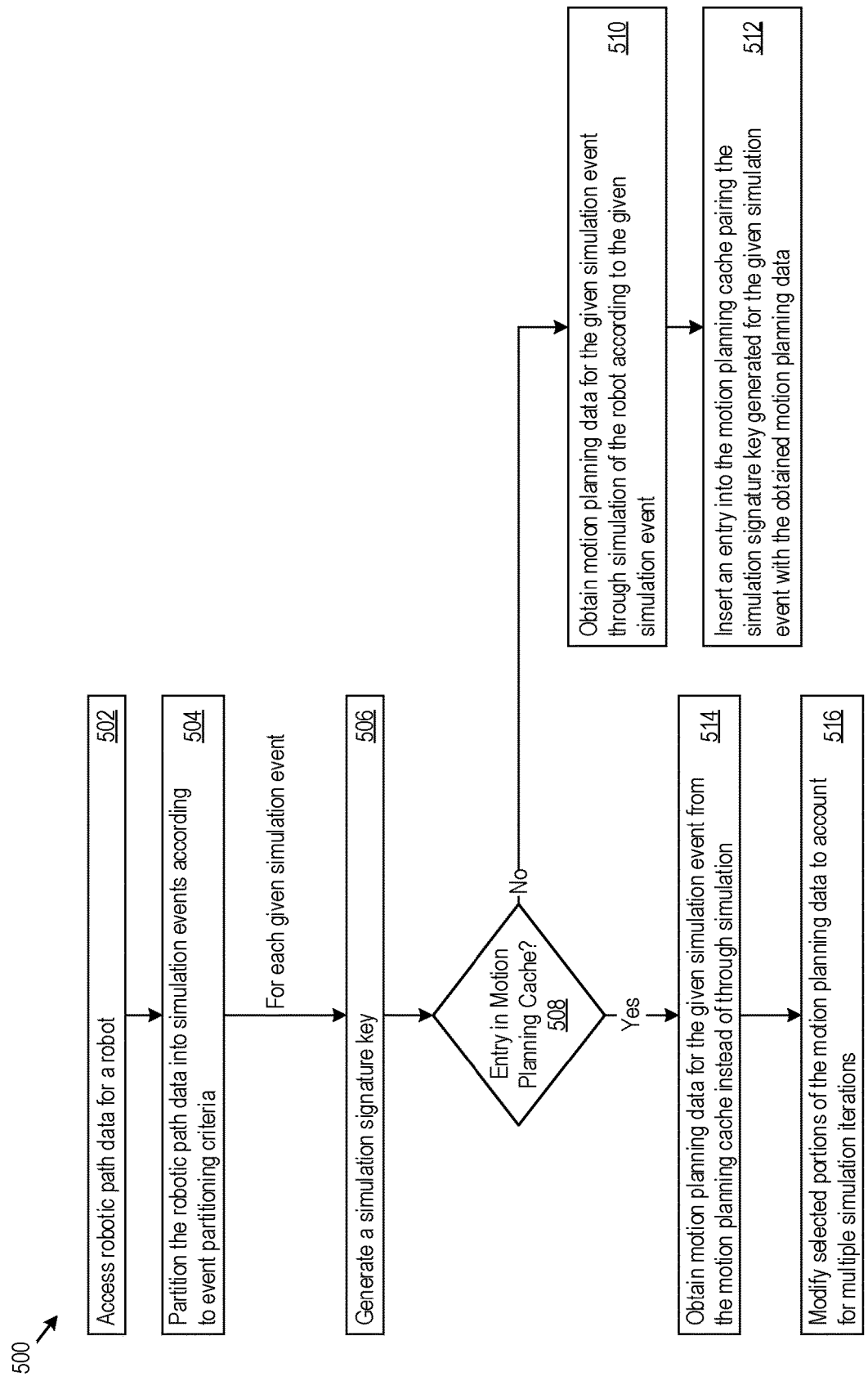
FIG. 5 shows an example of logic that a system may implement to support generation and use of simulation signature keys for robotic simulations.

FIG. 5 shows an example of logic 500 that a system may implement to support generation and use of simulation signature keys for robotic simulations. For example, the system 100 may implement the logic 500 as hardware, executable instructions stored on a machine-readable medium, or as a combination of both. The system 100 may implement the logic 500 via the robotic simulation engine 110, through which the system 100 may perform or execute the logic 500 as a method to generate use simulation signature keys for robotic simulations. The following description of the logic 500 is provided using the robotic simulation engine 110 as an implementation example. However, various other implementation options by a system are possible.

In implementing the logic 500, the robotic simulation engine 110 may access robotic path data for a robot (502) and partition the robotic path data into simulation events according to event partitioning criteria (504). For each given simulation event partitioned from the robotic path data, the robotic simulation engine 110 may generate a simulation key (506). In some implementations, the robotic simulation engine 110 may generate the simulation signature key for the given simulation event by hashing a selected subset of the one or more target locations and corresponding motion parameters for the given simulation event. Hashing the selected subset may include hashing a concatenation of robot configuration data, robot location data, the one or more target locations, target zone data, robot speed data, and robot motion type data of the given simulation event.

The robotic simulation engine 110 may determine whether an entry exists in a motion planning cache 120 for the simulation signature key generated for the given simulation event (508). If no entry exists, the robotic simulation engine 110 may obtain motion planning data for the given simulation event through simulation of the robot according to the given simulation event (510). This may include use of a RRS simulator using the given simulation event as an input for simulation and generation of motion planning data. In such cases, the robotic simulation engine 110 may insert an entry into the motion planning cache 120 pairing the simulation signature key generated for the given simulation event with the obtained motion planning data (512).

If an entry exists in the motion planning cache 120 for the generated simulation signature key, the robotic simulation engine 110 may obtain motion planning data for the given simulation event from the motion planning cache instead of the through simulation (514). In some implementations, the robotic simulation engine 110 may also modify selected portions of the motion planning data to account for multiple simulation iterations (516), e.g., via any of modification or insertion techniques described herein.

While an example implementation is shown through FIG. 5, the logic 500 may include any number of additional or alternative steps as well. The logic 500 may additionally or alternatively implement any other robotic simulation features described herein, for example any with respect to the robotic simulation engine 110.

Figure 6:
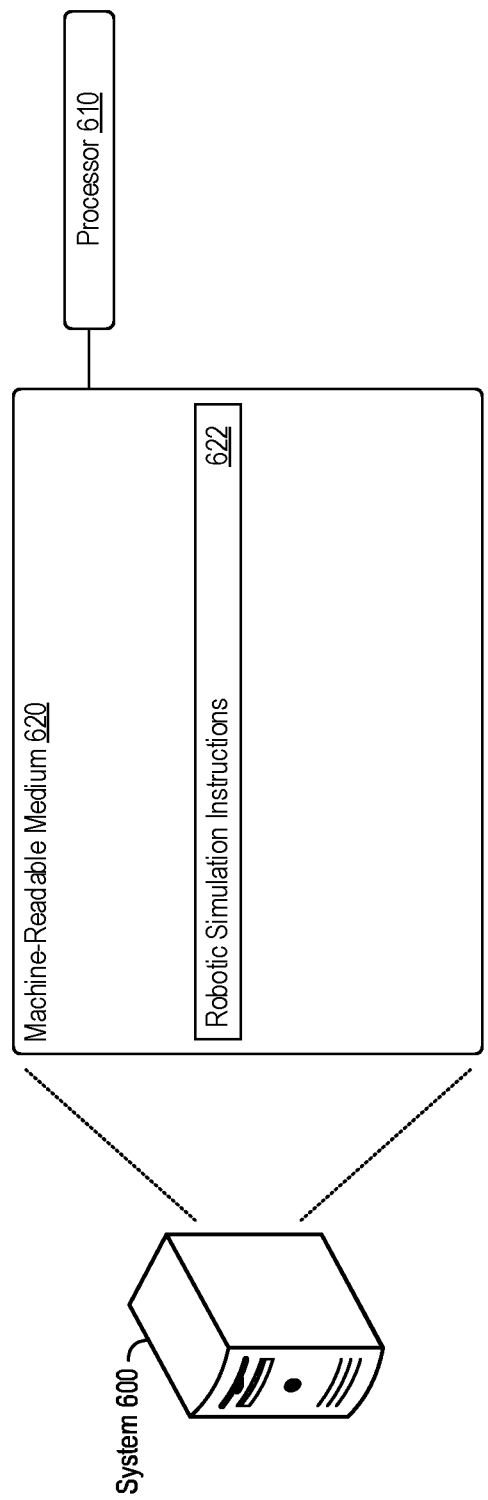
FIG. 6 shows an example of a system that supports generation and use of simulation signature keys for robotic simulations.

FIG. 6 shows an example of a system 600 that supports generation and use of simulation signature keys for robotic simulations. The system 600 may include a processor 610, which may take the form of a single or multiple processors. The processor(s) 610 may include a central processing unit (CPU), microprocessor, or any hardware device suitable for executing instructions stored on a machine-readable medium. The system 600 may include a machine-readable medium 620. The machine-readable medium 620 may take the form of any non-transitory electronic, magnetic, optical, or other physical storage device that stores executable instructions, such as the robotic simulation instructions 622 shown in FIG. 6. As such, the machine-readable medium 620 may be, for example, random access memory (RAM) such as a dynamic RAM (DRAM), flash memory, spin-transfer torque memory, an electrically-erasable programmable read-only memory (EEPROM), a storage drive, an optical disk, and the like.

The system 600 may execute instructions stored on the machine-readable medium 620 through the processor 610. Executing the instructions may cause the system 600 (or any other CAD system) to perform any of the robotic simulation features described herein, including according to any of the features of the robotic simulation engine 110.

For example, execution of the robotic simulation instructions 622 by the processor 610 may cause the system 600 to access robotic path data for a robot; partition the robotic path data into simulation events according to event partitioning criteria such that each simulation event includes a sequence of one or multiple target locations and corresponding motion parameters; and for each given simulation event of the robotic path data: generate a simulation signature key for the given simulation event using the sequence of one or more target locations and corresponding motion parameters for the given simulation event; obtain motion planning data for the given simulation event through simulation of the robot according to the given simulation event; and insert an entry into a motion planning cache pairing the simulation signature key for the given simulation event with the motion planning data obtained for the given simulation event.

Execution of the robotic simulation instructions 622 by the processor 610 may further cause the system 600 to access additional robotic path data for the robot; partition the additional robotic path data into additional simulation events according to the event partitioning criteria; and for each additional simulation event of the additional robotic path data: generate a simulation signature key for the additional simulation event; and obtain motion planning data from the motion planning cache for the additional simulation event when with the simulation signature key for the additional simulation event is already stored in the motion planning cache.

The systems, methods, devices, and logic described above, including the robotic simulation engine 110, may be implemented in many different ways in many different combinations of hardware, logic, circuitry, and executable instructions stored on a machine-readable medium. For example, the robotic simulation engine 110 may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. A product, such as a computer program product, may include a storage medium and machine readable instructions stored on the medium, which when executed in an endpoint, computer system, or other device, cause the device to perform operations according to any of the description above, including according to any features of the robotic simulation engine 110.

The processing capability of the systems, devices, and engines described herein, including the robotic simulation engine 110, may be distributed among multiple system components, such as among multiple processors and memories, optionally including multiple distributed processing systems or cloud/network elements. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library (e.g., a shared library).

While various examples have been described above, many more implementations are possible.

The invention claimed is:

1. A method comprising:
   accessing robotic path data for a robot, the robotic path data comprising target locations and corresponding motion parameters for the robot;
   partitioning the robotic path data into simulation events according to event partitioning criteria such that each simulation event includes one or multiple target locations and corresponding motion parameters; and
   for a given simulation event:
      generating a simulation signature key for the given simulation event using the one or more target locations and corresponding motion parameters for the given simulation event;
      simulating the robot according to the given simulation event to output motion planning data for the given simulation event;
      obtaining the motion planning data for the given simulation event output through the simulation of the robot according to the given simulation event; and
      associating the simulation signature key for the given simulation event with the motion planning data obtained for the given simulation event, including by inserting an entry into a motion planning cache that pairs the simulation signature key for the given simulation event with the motion planning data obtained for the given simulation event, and
   after simulating the robot according to the given simulation event and inserting the entry into the motion planning cache:
      accessing additional robotic path data for the robot different from the robotic path data for the robot;
      partitioning, according to the event partitioning criteria, the additional robotic path data into simulation events that include an additional simulation event;
      generating a simulation signature key for the additional simulation event of the additional robotic path data;
      determining that the simulation signature key generated for the additional simulation event matches the simulation signature key generated for the given simulation event of the robotic path data; and
      accessing obtained motion planning data for the additional simulation event from the motion planning cache without simulating the robot according to the additional simulation event for the additional robotic path data for the robot different from the robotic path data for the robot.

2. The method of claim 1, wherein the simulation events partitioned for the additional robotic path data includes another additional simulation event different from the additional simulation event, and further comprising, after simulating the robot according to the given simulation event and inserting the entry into the motion planning cache:
   generating a simulation signature key for the another additional simulation event of the additional robotic path data;
   determining that the motion planning cache does not include an entry for the simulation signature key generated for the another additional simulation event;
   simulating the robot according to the another additional simulation event to obtain motion planning data for the additional simulation event; and
   inserting an entry into the motion planning cache that pairs the simulation signature key for the another additional simulation event with the motion planning data obtained for the another additional simulation event through simulation.

3. The method of claim 1, further comprising, prior to inserting the entry into the motion planning cache:
   modifying selected portions of the motion planning data obtained for the given simulation event to account for multiple simulation iterations of the given simulation event.

4. The method of claim 1, wherein generating the simulation signature key for the given simulation event comprises:
   hashing a selected subset of the one or more target locations and corresponding motion parameters for the given simulation event.

5. The method of claim 4, wherein hashing the selected subset comprises hashing a concatenation of robot configuration data, the one or more target locations, target zone data, robot speed data, and robot motion type data of the given simulation event.

6. The method of claim 1, wherein partitioning the robotic path data into simulation events according to the event partitioning criteria is based on target zone data in the robotic path data, the target zone data specifying whether the robot reaches a given target location by precisely reaching the given target location or by reaching a zone surrounding the given target location; and
   wherein partitioning the robotic path data into simulation events such that each of the simulation events ends with a target location that the target zone data specifies the robot is to precisely reach.

7. A system comprising:
   a motion planning cache; and
   a robotic simulation engine configured to:
      access robotic path data for a robot, the robotic path data comprising target locations and corresponding motion parameters for the robot;
      partition the robotic path data into simulation events according to event partitioning criteria such that each simulation event includes one or multiple target locations and corresponding motion parameters; and
      for each given simulation event of the robotic path data:
         generate a simulation signature key for the given simulation event using the one or more target locations and corresponding motion parameters for the given simulation event;
         responsive to a determination that the motion planning cache already includes an entry for the simulation signature key generated for the given simulation event:

obtain motion planning data already stored in the motion planning cache for the given simulation event from the entry for the simulation signature key; and responsive to a determination that the motion planning cache does not include an entry for the simulation signature key generated for the given simulation event:

simulate the robot according to the given simulation event to output motion planning data for the given simulation event;

obtain the motion planning data for the given simulation event output through the simulation of the robot according to the given simulation event; and insert an entry into the motion planning cache pairing the simulation signature key for the given simulation event with the motion planning data obtained for the given simulation event output through the simulation of the robot according to the given simulation event;

access additional robotic path data for the robot;

partition the additional robotic path data into simulation events according to the event partitioning criteria;

generate a simulation signature key for each of the simulation events of the additional robotic path data; and obtain motion planning data from the motion planning cache for simulation events of the additional robotic path data with simulation signature keys already stored in the motion planning cache and without simulation of the simulation events of the additional robotic path data with simulation signature keys already stored in the motion planning cache.

8. The system of claim 7, wherein the robotic simulation engine is configured to, for each particular simulation event of the additional robotic path data without its simulation signature key already stored in the motion planning cache:

simulate the robot according to the particular simulation event to obtain motion planning data as an output of the simulation of the robot according to the particular simulation event; and insert an entry into the motion planning cache that pairs the simulation signature key for the particular simulation event with the obtained motion planning data for the particular simulation event.

9. The system of claim 7, wherein the event partitioning criteria is based on target zone data in the robotic path data, the target zone data specifying whether the robot reaches a given target location by precisely reaching the given target location or by reaching a zone surrounding the given target location.

10. The system of claim 9, wherein the robotic simulation engine is configured to partition the robotic path data into the simulation events such that each of the simulation event ends with a target location that the target zone data specifies the robot is to precisely reach.

11. The system of claim 9, wherein the robotic simulation engine is configured to partition the simulation events such that at least one of the simulation events includes a sequence of multiple target locations and corresponding motion parameters.

12. A non-transitory machine-readable medium comprising processor-executable instructions that, when executed, cause a system to:

access robotic path data for a robot, the robotic path data comprising target locations and corresponding motion parameters for the robot;

partition the robotic path data into simulation events according to event partitioning criteria such that each simulation event includes a sequence of one or multiple target locations and corresponding motion parameters;

for each given simulation event of the robotic path data:

generate a simulation signature key for the given simulation event using the sequence of one or more target locations and corresponding motion parameters for the given simulation event;

simulate the robot according to the given simulation event to output motion planning data for the given simulation event;

obtain the motion planning data for the given simulation event output through the simulation of the robot according to the given simulation event; and insert an entry into a motion planning cache pairing the simulation signature key for the given simulation event with the motion planning data obtained for the given simulation event; and access additional robotic path data for the robot different from the robotic toolpath for the robot;

partition the additional robotic path data into additional simulation events according to the event partitioning criteria; and for each additional simulation event of the additional robotic path data:

generate a simulation signature key for the additional simulation event;

obtain motion planning data from the motion planning cache for the additional simulation event when with the simulation signature key for the additional simulation event is already stored in the motion planning cache and without simulation of the additional simulation event; and when the simulation signature key for the additional simulation event is not already stored in the motion planning cache:

simulate the robot according to the additional simulation event to obtain motion planning data; and insert an entry into the motion planning cache that pairs the simulation signature key for the additional simulation event with the obtained motion planning data for the additional simulation event.

13. The non-transitory machine-readable medium of claim 12, wherein the event partitioning criteria is based on target zone data in the robotic path data, the target zone data specifying whether the robot reaches a given target location by precisely reaching the given target location or by reaching a zone surrounding the given target location.

14. The non-transitory machine-readable medium of claim 13, wherein the processor-executable instructions, when executed, further cause the system to partition the robotic path data into the simulation events such that each of the simulation event ends with a target location that the target zone data specifies the robot is to precisely reach.

15. The non-transitory machine-readable medium of claim 13, wherein the processor-executable instructions, when executed, further cause the system to partition the simulation events such that at least one of the simulation events includes a sequence of multiple target locations and corresponding motion parameters.

16. The non-transitory machine-readable medium of claim 12, wherein the processor-executable instructions, when executed, cause the system to generate a simulation signature for the given simulation event by hashing a selected subset of the one or more target locations and corresponding motion parameters for the given simulation event.

\* \* \* \* \*